United States Patent [19]

Zheng et al.

[11] Patent Number: 5,883,853
[45] Date of Patent: *Mar. 16, 1999

[54] CLOCK FREQUENCY DETECTOR FOR A SYNCHRONOUS MEMORY DEVICE

[75] Inventors: Hua Zheng; Jeffrey P. Wright, both of Boise, Id.

[73] Assignee: Micron Technology, Inc., Boise, Id.

[ * ] Notice: The term of this patent shall not extend beyond the expiration date of Pat. No. 5,784,332.

[21] Appl. No.: 971,785

[22] Filed: Nov. 17, 1997

Related U.S. Application Data

[62] Division of Ser. No. 764,488, Dec. 12, 1996, Pat. No. 5,784,332.

[51] Int. Cl.$^6$ ..................................................... G11C 8/00
[52] U.S. Cl. ............................................. 365/233; 326/93
[58] Field of Search ................................ 365/233; 326/93

[56] References Cited

U.S. PATENT DOCUMENTS

| | | | |
|---|---|---|---|
| 4,734,880 | 3/1988 | Collins | 364/900 |
| 4,748,644 | 5/1988 | Silver et al. | 375/120 |
| 4,841,167 | 6/1989 | Saegusa | 307/269 |
| 5,086,387 | 2/1992 | Arroyo et al. | 395/556 |
| 5,136,180 | 8/1992 | Caviasca et al. | 327/115 |
| 5,287,319 | 2/1994 | Fukumoto | 365/222 |
| 5,319,681 | 6/1994 | Meyer | 375/119 |
| 5,483,496 | 1/1996 | Murakawa | 365/233 |
| 5,521,879 | 5/1996 | Takasugi | 365/233 |
| 5,600,606 | 2/1997 | Rao | 365/233 |

*Primary Examiner*—David Nelms
*Assistant Examiner*—Hoai V. Ho
*Attorney, Agent, or Firm*—Seed and Berry LLP

[57] ABSTRACT

The present invention employs a clock frequency detector in a SDRAM that detects whether an input clock signal is operating at a fast rate (e.g., 125 MHz or a 8 nanosecond access time), or at a slower rate. In response to the input clock frequency, the clock frequency detector outputs a selection signal to control logic circuitry in the SDRAM indicating whether the SDRAM should operate in either a fast or slow mode. The clock frequency detector employs a frequency detector that detects the frequency of the input clock signal. Based on the frequency of the input clock signal, a selector circuit outputs either a fast or slow selection signal to the control logic circuitry. In response to the fast selection signal, the control logic circuitry performs data access commands at a fast rate, while in response to the slow selection signal, the control logic circuitry executes such commands at a slower, more conservative rate. As a result, the SDRAM device can operate according to its maximum specifications in connection with a fast input clock rate (allowing essentially no margins for error), or perform at a slower rate based on a slower input clock frequency (allowing for some margin of error).

34 Claims, 8 Drawing Sheets

CLOCK FREQUENCY DETECTOR FOR A SYNCHRONOUS MEMORY DEVICE

CROSS-REFERENCE TO RELATED APPLICATION

This application is a division of U.S. patent application Ser. No. 08/764,488, filed Dec. 12, 1996 now U.S. Pat. No. 5,784,332.

TECHNICAL FIELD

This invention relates generally to electronic devices, and more particularly, to synchronous memory devices.

BACKGROUND OF THE INVENTION

As computer software applications continually become more complex, and as multiple applications run simultaneously (e.g., multitasking), the computers on which the software applications run must increasingly become faster to avoid processor delay times and other time lags that can be annoying to a computer user. A significant limitation on the computer's operating speed is the time required to transfer data between the processor and a memory circuit. Typical memory circuits, such as dynamic random access memories (DRAMs), include a large number of memory cells arranged in one or more arrays, each array having rows and columns. The memory cells provide locations at which the processor can store and retrieve data including program instructions.

The more quickly the processor can access the data within the memory cells, the more quickly it can perform calculations or execute software applications using the data. As the need grows for decreased data access times, new types of memory devices are being developed. For example, certain memory devices allow data from groups of memory cells to be output from a DRAM based on an initial request from the processor. Page mode DRAM or burst extended data out (BEDO) memory allows a large amount of data to be rapidly output to a processor, thereby improving the effective speed of the memory device.

To further improve the access time to memory cells, synchronous DRAM (SDRAM) devices have been developed. When a typical DRAM device receives a read or write command and an address, the data transfer must be performed in its entirety before the device can accept another command Consequently, subsequent commands or processor operations are delayed by the entire duration of the first data transfer. Because data transfer typically involves several steps and each step takes time, the overall time to perform the first data transfer in a DRAM device may be significant.

In SDRAM devices, operations are "pipelined" in that each of the several steps required to transfer data is performed according to a specific timing sequence. The timing sequence is established relative to a clock signal, typically an external clock signal in the computer that controls the processor. As a result, both the processor and the SDRAM are synchronized under the same clock. Therefore, in theory, if the clock frequency is increased, the data transfer to and from the SDRAM can be similarly increased.

As the clock frequency increases, the time required to perform each of the various commands and steps to transfer data to and from the memory device decreases. Current SDRAM devices can operate at a clock speed of 100 MHz (equal to a period of 10 nanoseconds). All of the data transfer steps to read data to, or write data from, the SDRAM can be performed in approximately 9 nanoseconds. Thus, at a clock speed of 100 MHz, there is a 1 nanosecond margin of error. Such a tiny margin of error requires that the SDRAM device perform substantially flawlessly, with essentially no margin of error for delays within the device.

It would be desirable to be able to operate the SDRAM device at a slower clock speed, and thereby provide a greater margin of error for the device. Indeed, most computer designers and other engineers employing SDRAM devices employ such devices in systems operating at a variety of clock speeds. Therefore, it also would be desirable to have a SDRAM device capable of operating at both a fast clock rate (approximately 125 MHz) as well as slower speeds (66 MHz or less), to compensate for various external clocks with which the SDRAM device may be employed.

SUMMARY OF THE INVENTION

The present invention employs a clock frequency detector in a SDRAM that detects whether an input clock signal is operating at a fast rate (e.g., 100 MHz or a 10 nanosecond access time), or at a slower rate. In response to the input clock frequency, the clock frequency detector outputs a selection signal to control logic circuitry in the SDRAM indicating whether the SDRAM should operate in either a fast or slow mode. The clock frequency detector employs a frequency detector that detects the frequency of the input clock signal. Based on the detected frequency of the input clock signal, a selector circuit outputs either a fast or slow selection signal to the control logic circuitry. In response to the fast selection signal, the control logic circuitry performs data access commands at a fast rate, while in response to the slow selection signal, the control logic circuitry executes such commands at a slower, more conservative rate. As a result, the SDRAM device can operate according to its maximum specifications in connection with a fast input clock rate (allowing essentially no margins for error), or perform at a slower rate based on a slower input clock frequency (allowing for some margin of error).

In a broad sense, the present invention embodies a system for use in a device, where the device has two modes of operation that are selectable based on a clock signal, and where the clock signal has a predetermined frequency. The system includes a control circuit and a clock frequency detector. The control circuit receives the clock signal and is capable of operating the device in at least first and second modes of operation.

The clock frequency detector includes a frequency detector circuit and a selector circuit. The frequency detector circuit receives the clock signal and determines the predetermined frequency of the clock signal. The selector circuit is coupled to the frequency detector and to the control circuit, and outputs one of a first and second selection signal to the control circuit in response to the predetermined frequency determined by the frequency detector. The control circuit operates the device in the first or second mode based on the first or second selection signal, respectively.

The present invention also embodies a computer system comprising an input device, an output device, an address bus, a data bus, a set of control lines, a memory controller, a processor, and a memory device. The memory controller is coupled to the address and data buses and to the set of control lines. The processor is coupled to the input and output devices, and to the address and data buses and the set of control lines. The memory device is coupled to the memory controller through the address and data buses and the set of control lines. The memory device includes an array of memory cells, a control circuit coupled to the array of memory cells, and a clock frequency detector.

The control circuit is operable to transfer data to and from the array of memory cells based on a predetermined frequency of the clock signal. The clock frequency detector has a frequency detector and a selector circuit. The frequency detector receives the clock signal and determines the predetermined frequency of the clock signal. The selector circuit is coupled to the frequency detector and to the control circuit and outputs one of a first and second selection signal to the control circuit in response to the predetermined frequency determined by the frequency detector. The control circuit operates in the first or second mode based on the first or second selection signal, respectively.

The present invention solves problems inherent in the prior art of semiconductor memory devices by allowing a memory device, preferably a SDRAM, to operate in at least two speeds based upon the rate of the incoming clock signal. Other features and advantages of the present invention will become apparent to those skilled in the relevant art from studying the following detailed description of the presently preferred embodiment, together with the following drawings.

DETAILED DESCRIPTION OF THE PREFERRED EMBODIMENT

Figure 1:
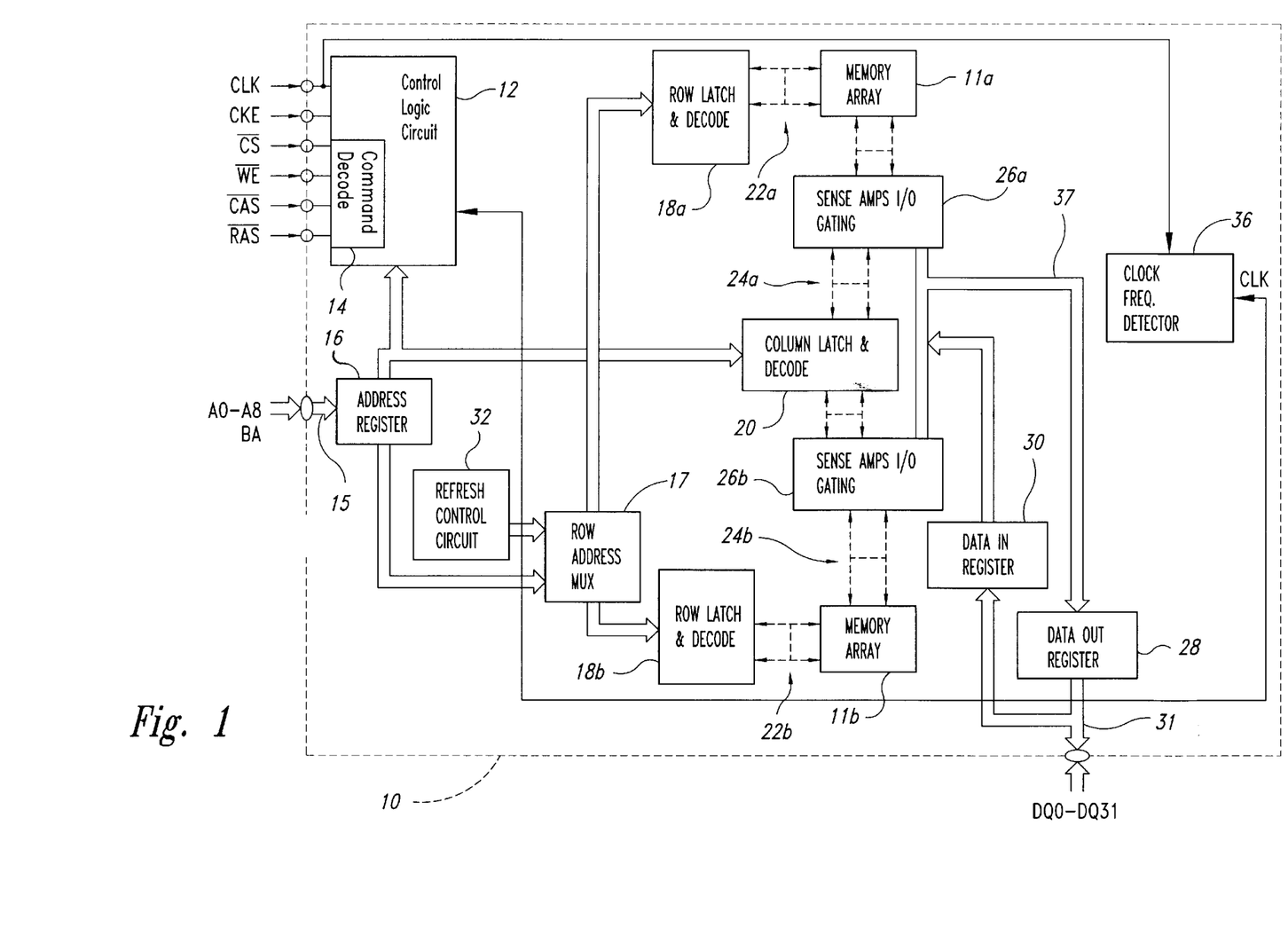
FIG. 1 is a block diagram showing a memory device having a Clock Frequency Detector according to the present invention.

The present invention is preferably embodied in a memory device, such as a synchronous dynamic random access memory (SDRAM) device. Referring to FIG. 1, an exemplary SDRAM memory device 10 includes as its central memory two memory array banks 11A and 11B. Each of the memory arrays 11A and B includes a plurality of memory cells (not shown) arranged in rows and columns. A control logic circuit 12 controls the data transfer steps associated with a read or write access to the memory cells in the arrays 11A and B. For example, each of the arrays 11A and B has memory cells can be arranged in 512 rows by 256 columns by 32 bits. As a result, the memory device 10 has a width of 32-bits—meaning that to a specified memory address (combined bank, row and column address) there is a one-to-one correspondence with 32 memory cells in one of the arrays 11A and B, and a processor (not shown in FIG. 1) operates on data elements of 32 bits each.

A system clock (not shown) provides an input clock signal CLK to the control circuit 12 of the memory device 10. Command signals are provided to the control circuit 12 and decoded by command decode circuitry 14. These signals are well known in the art, and include signals such as CKE (clock enable), $\overline{CS}$ (chip select), $\overline{WE}$ (write enable), $\overline{RAS}$ (row address strobe) and $\overline{CAS}$ (column address strobe). The line or bar over the acronym for the control signals generally indicates that the active state for the particular signal is a logical low value. Distinct combinations of the various command signals constitute distinct processor commands. For example, the combination of $\overline{CS}$ low, $\overline{WE}$ high, $\overline{RAS}$ low and $\overline{CAS}$ high can represent an ACTIVE command. Examples of other well-known commands include READ, WRITE, NOP and PRECHARGE. Although the processor actually produces distinct command signals that in combination are registered and decoded as commands by the memory device 10, it is convenient to simply refer to the commands (e.g., READ, WRITE, etc.) as being issued by the processor.

The control circuit 12 sends control signals on control lines (not shown) to other parts of the memory device 10, corresponding to the processor-issued command. These control signals control the timing of access to the memory cells in arrays 11A and 11B. The memory device 10 is also provided with an address of the memory location to be accessed on a 10-bit wide address bus 15, including a bank address specified by address bit BA and a row or column address specified by address bits A0–A8. The address is input to an address register 16 which provides the address information to the control circuit 12, a row-address mux 17, and a column-address latch and decode circuit 20.

In response to one or more control signals provided by the control circuit 12, the row-address mux 17 multiplexes row address information and provides it to one of two row-address latch and decode circuits 18A and 18B corresponding to the memory banks 11A and B to be accessed. In response to one or more control signals provided by the control circuit 12, each of the row latch and decode circuits 18A and 18B takes a row address provided by the row-address mux 17 and activates a selected row of memory cells (not shown) in the memory array 11A and 11B by selecting one of several row access lines 22A and 22B, respectively. In response to one or more control signals provided by the control circuit 12, the column latch and decode circuit 20 takes a column address provided by the address register 16 and selects one of several column access lines 24A and 24B, each of which is coupled to one of the memory arrays 11A and 11B by one of two I/O interface circuits 26A and 26B, respectively. In response to one or more control signals provided by the control circuit 12, each of the I/O interface circuits 26A and B selects the 32 memory cells corresponding to the column location in an activated row. The I/O interface circuits 26A and B include sense amplifiers which determine and amplify the logic state of the selected memory cells. The I/O interface circuits 26A and B also include I/O circuits that gate data to a data output register 28 and from a data input register 30, responsive to one or more control signals provided by the control circuit 12. The data registers 28 and 30 are connected to a 32-bit wide data bus 31 and transfer output data Q0–Q31 to a processor and input data D0–D31 from a processor, responsive to one or more control signals provided by the control circuit 12.

The memory device 10 includes a refresh control circuit 32 which, responsive to one or more control signals provided by the control circuit 12, initiates regular and periodic activation of each of the rows of the memory cells in the arrays 11A and B for purposes of data refresh, as is well known in the art. In response to one or more control signals provided by the control circuit 12, a respective one of the I/O interface circuits 26A and 26B senses data stored in the memory cells of the refresh-activated row and rewrites values corresponding to the stored data in each of the memory cells.

A clock frequency detector 36 receives the input clock signal CLK. As described more fully below, the clock frequency detector 36 analyzes the frequency of the clock signal CLK and outputs a control signal to the control circuit 12 to select between at least a fast and a slow mode of operation for the memory device 10.

Figure 2:
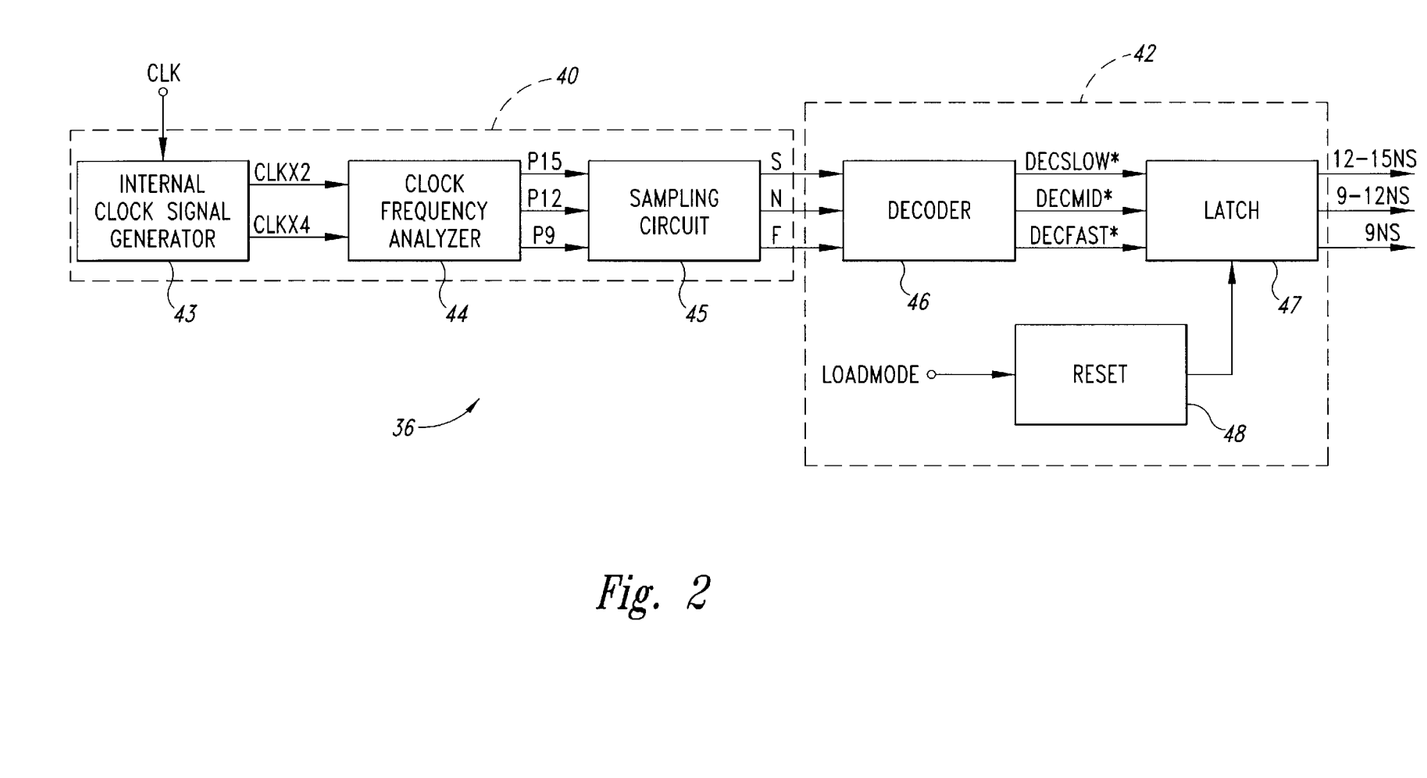
FIG. 2 is a block diagram of the Clock Frequency Detector of the memory device of FIG. 1.

Referring to FIG. 2, the clock frequency detector 36 includes a frequency detector circuit 40 and a selector circuit 42. To summarize the operation of the clock frequency detector 36, the frequency detector circuit 40 is coupled to an input terminal for the memory device 10 to receive the clock signal CLK. The frequency detector circuit 40 detects the frequency of the clock signal CLK, or more specifically, generates signals that indicate whether the clock signal CLK is fast (about 125 MHz for a data access period of less than 9 nanoseconds), middle or normal (about 100 MHz for an access period of 9–12 nanoseconds) or slow (about 66 MHz for an access period of 12–15 nanoseconds). In response thereto, the clock frequency detector outputs slow S), normal (N) and fast (F) signals, corresponding to the detected frequency.

A selector circuit 42, in response to the fast, normal and slow signals, outputs a fast, normal or slow selection control signal, respectively, to the control circuit 12. In response thereto, the control circuit 12, of known design, enables circuitry (not shown) that appropriately times the internal memory access operations for the memory device 10. For example, if the control circuit 12 receives the fast selection control signal from the selector circuit 42, then the control circuit shortens the internal time periods required to perform the various data access functions and commands described above (e.g., shortens the time for row and column addressing, row, precharging, data sensing, etc.). Conversely, if the control circuit 12 receives the slow selection command signal from the selector circuit 42, then the control circuit lengthens the time interval periods required to perform the various data access functions and commands. By lengthening the internal time periods required to perform a given command, the present invention allows the memory device 10 to gain a greater margin for error due to possible delays in sensing data from row lines, transferring data, etc.

The frequency detector circuit 40 includes an internal clock signal generator 43 that receives the input clock signal CLK and outputs first and second internal clock signals CLK2× and CLK4×, that are two and four times the period of the input clock signal CLK, respectively. A clock frequency analyzer 44 receives the first and second internal clock signals CLK2× and CLK4×, and outputs three signals in response thereto: P9, P12 and P15. A sampling circuit 45 samples the output signals P9, P12 and P15 and outputs fast (F), normal (N) and slow (S) sample signals, respectively.

The selector circuit 42 includes a decoder 46 that receives the fast (F), normal (N) and slow (S) sample signals, decodes them to determine whether the input clock signal CLK is fast, normal or slow, and outputs either a DECFAST*, DECMID*, or DECSLOW* decoded signal, respectively, to a latch 47. The latch 47 latches the received signal (DECFAST, DECMID, or DECSLOW) and outputs to the control circuit 12 appropriate selection control signals 9 NS, 9–12 NS and 12–15 NS corresponding to an input clock period of less than 9 nanoseconds (fast), between 9 and 12 nanoseconds (normal), or between 12 and 15 nanoseconds (slow), respectively A reset circuit 48, coupled to the latch 47, resets the latch after receiving a control LOADMODE signal from the control circuit 12.

Figure 3:
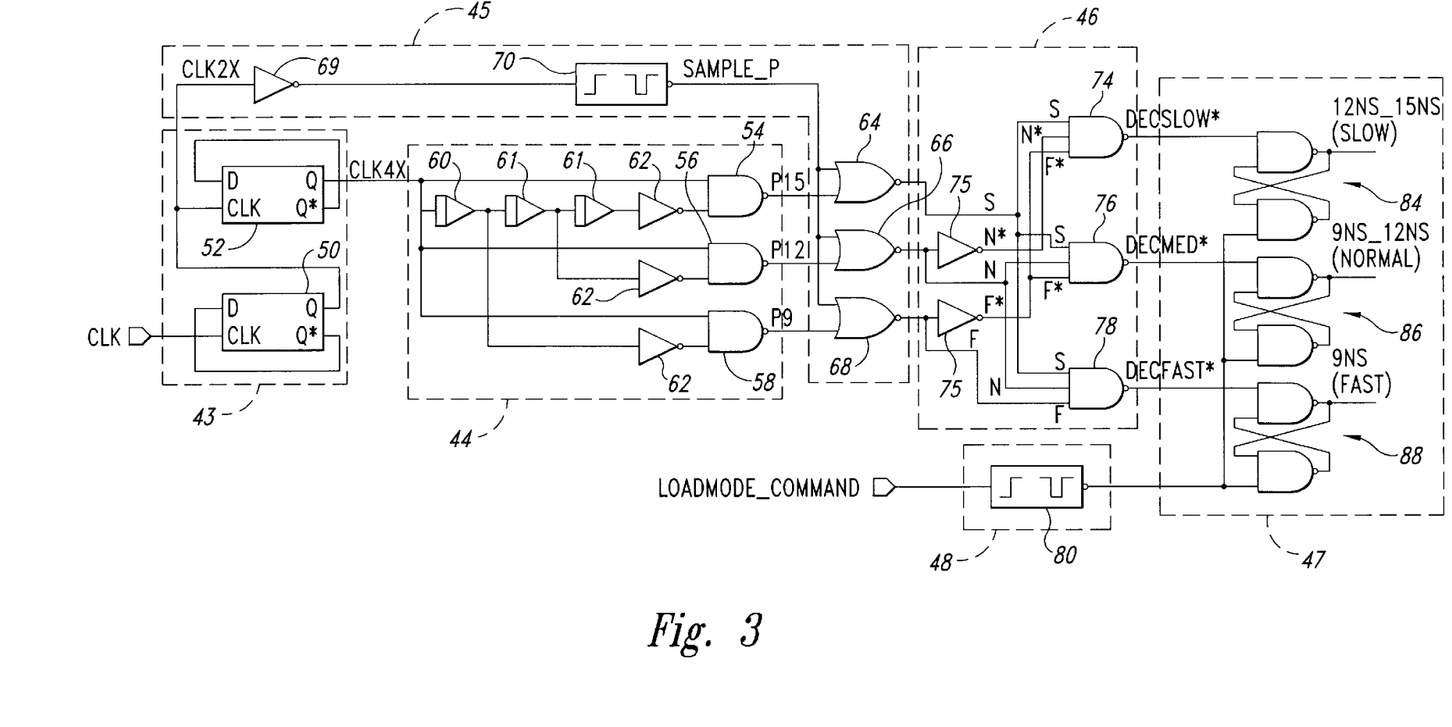
FIG. 3 is a schematic diagram of the Clock Frequency Detector of the memory device of FIG. 1.

Referring to FIG. 3, an exemplary circuit for implementing the various blocks shown in FIG. 2 will now be described. The internal clock signal generator 43 includes a pair of serially connected D flip-flops 50 and 52. Thus, the flip-flops 50, 52 operate essentially as a two-stage counter to twice divide the input clock signal by two to provide the first and second internal clock signals CLK2× and CLK4×. The inverted output, Q,* is fed back to the data input D for each of the flip-flops 50 and 52, while the non-inverted output, Q, of the first flip-flop 50 is input to the clock input CLK of the second flip-flop 52.

Figure 4:
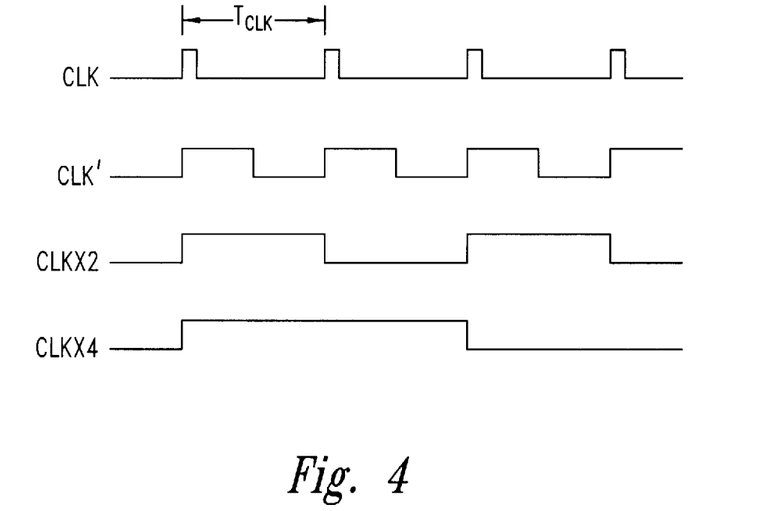
FIG. 4 is a timing diagram showing two alternative input clock waveforms CLK and CLK' and resulting internal clock waveforms CLK2× and CLK4× produced by the Clock Frequency Detector of FIG. 3.

Referring to FIG. 4, the clock frequency detector 36 of the present invention preferably operates with any of various types of input clock signals. As shown in FIG. 4, the input clock signal CLK can have a waveform with an initial short, high-value pulse during each period (shown as the CLK waveform). Alternatively, the input clock signal can have a waveform having approximately 50% of each period being a high value, while 50% of each period has a low value (shown as the CLK' waveform). Both of the exemplary input clock signals CLK and CLK' have a clock period of $T_{CLK}$.

With either input clock signal CLK or CLK', the first flip-flop 50 provides an output that changes state on the leading edge of each clock signal to output the first internal clock signal CLK2×. As shown in FIG. 4, the first internal clock signal CLK2× has twice the period $T_{CLK}$ of the input clock signal CLK (or half the frequency). The second flip-flop 52 receives the CLK2× signal at its clock input CLK, and outputs the second internal clock signal CLK4×, as shown in FIG. 4. The flip-flops 50 and 52 thus produce well-behaved internal clock signals CLK2× and CLK4×, regardless of the particular waveform of the input clock signal CLK. The second internal clock signal CLK4× has a period of twice that of the first internal clock signal CLK2×, and four times the period $T_{CLK}$ of the internal clock signal CLK (or one-fourth the frequency).

Figure 5:
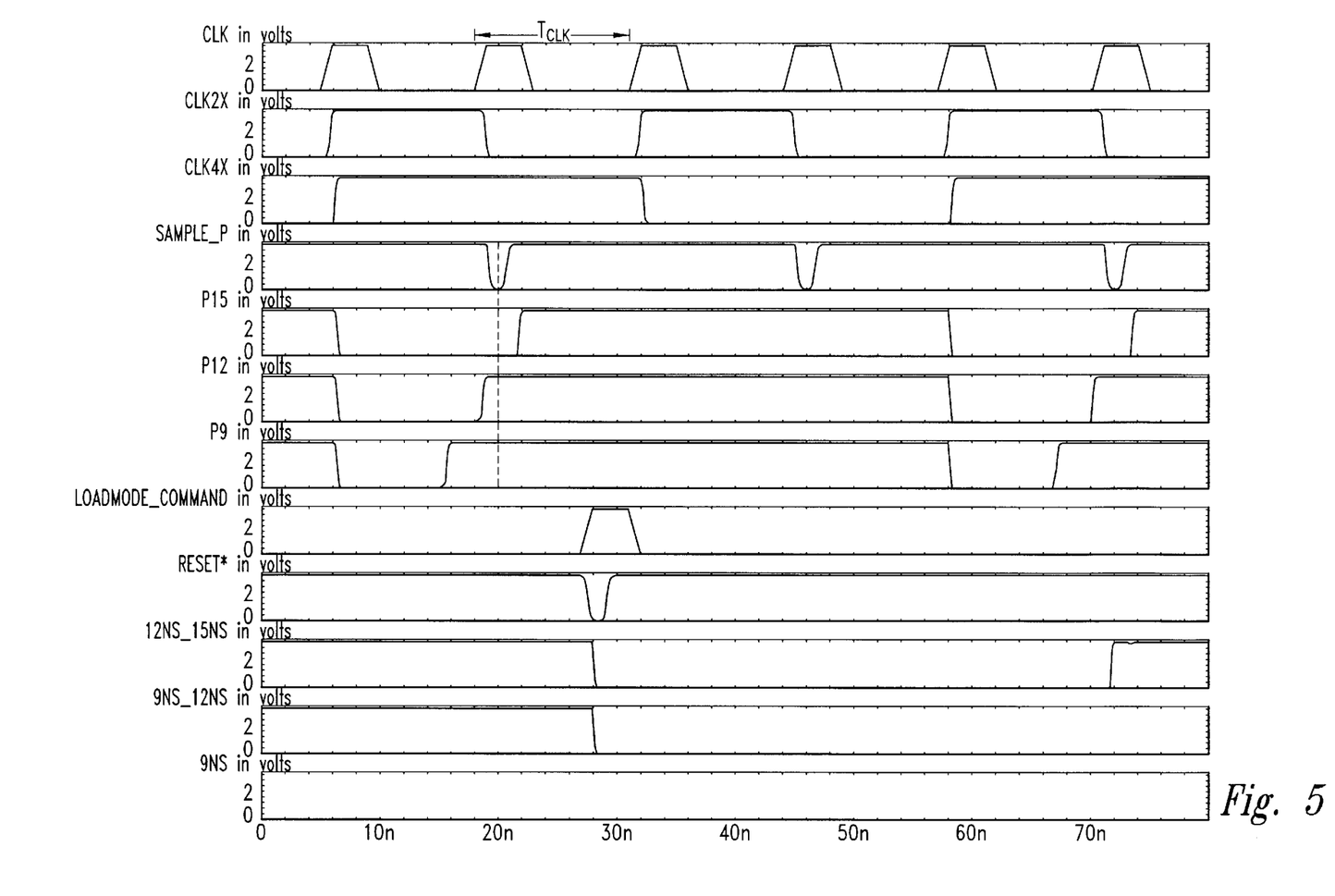
FIGS. 5, 6 and 7 are waveform and timing diagrams showing the input clock waveform CLK having periods of 8, 11 and 13 nanoseconds, respectively, and corresponding internal clock waveforms CLK2× and CLK4× and other waveforms generated by the clock frequency detector of FIG. 3 for the given input clock signal.
Figure 6:
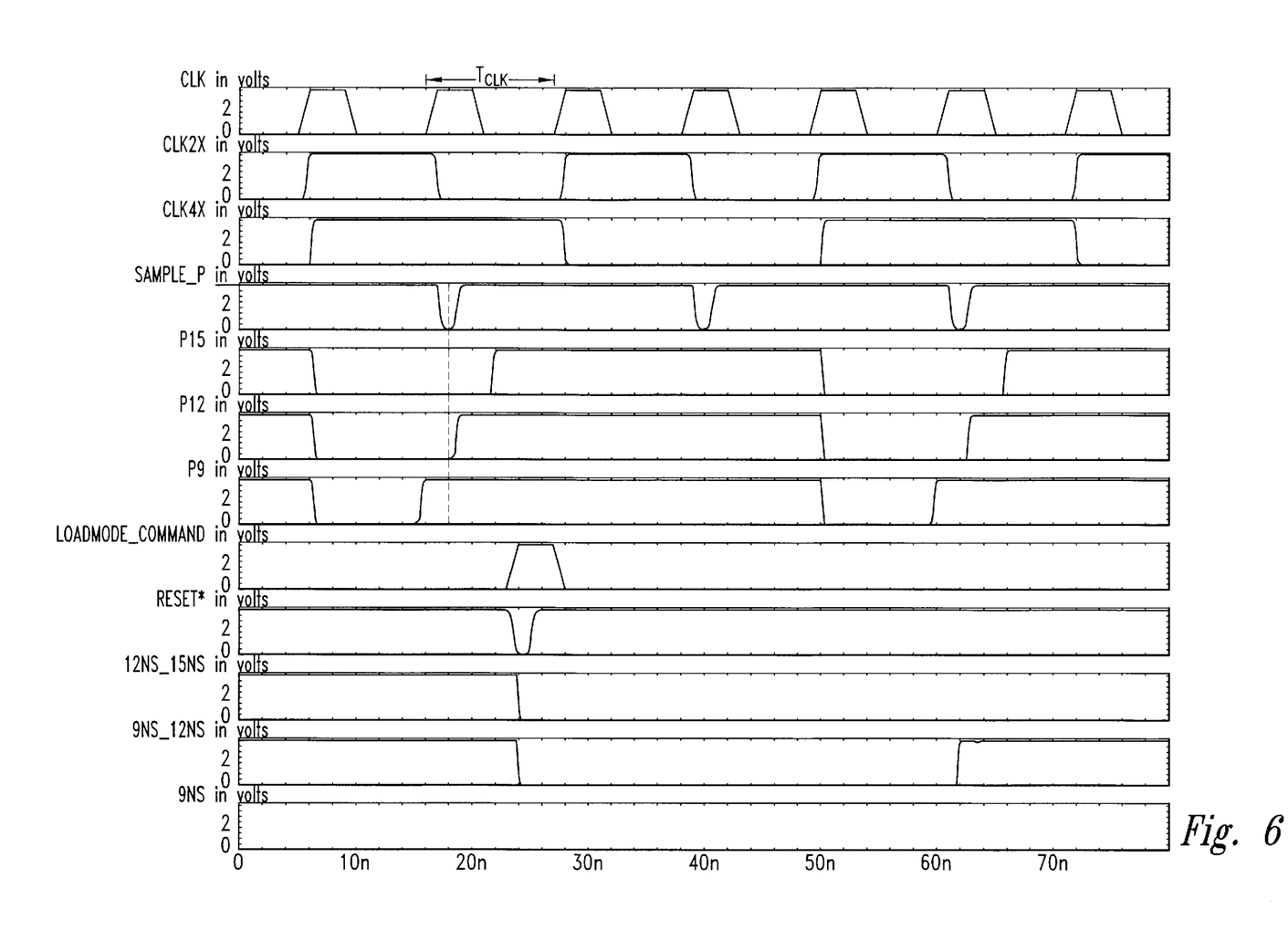
Figure 7:
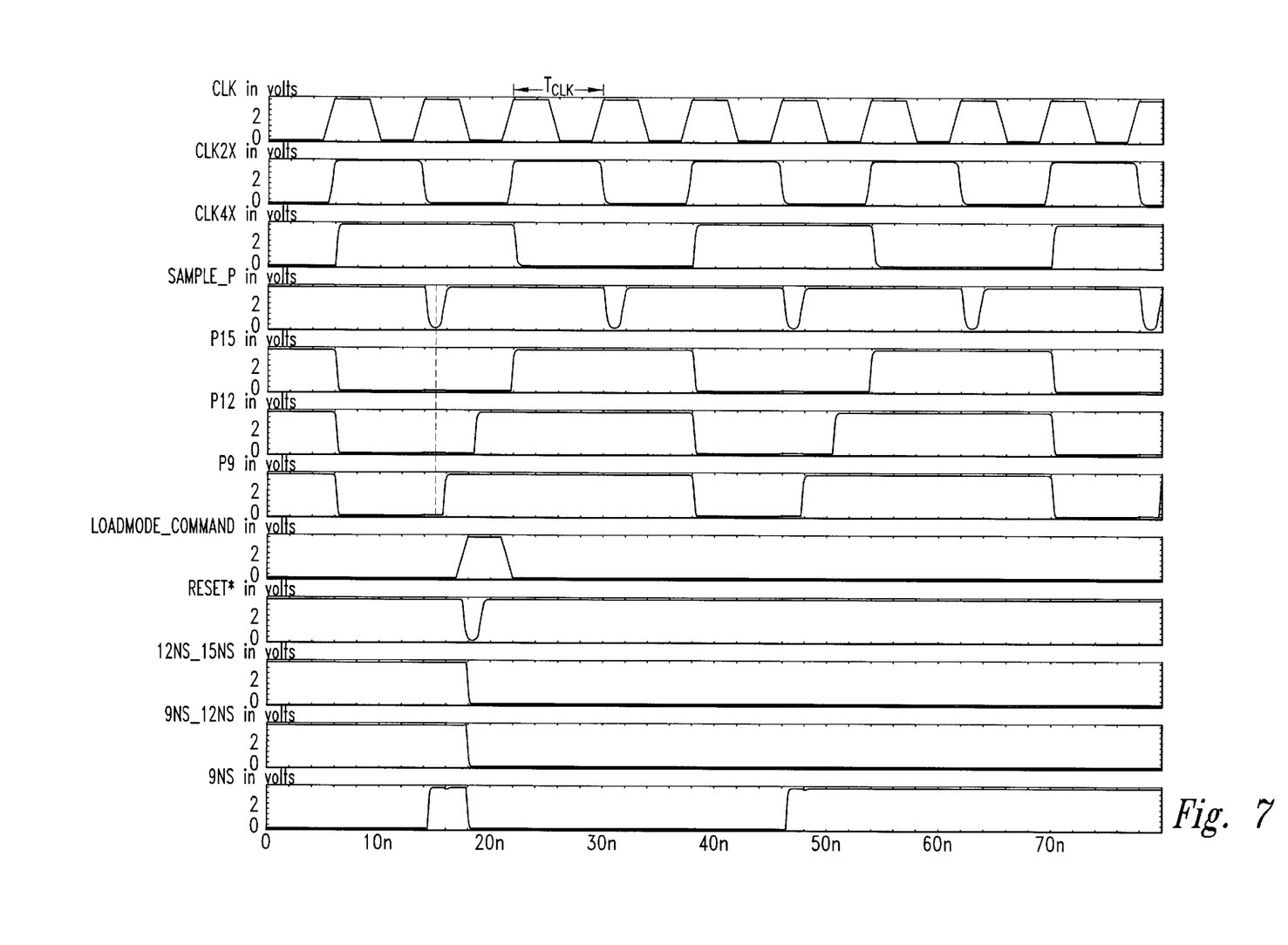

Referring to FIGS. 5, 6 and 7, the first and second internal clock signals CLK2× and CLK4× necessarily increase as the periods $T_{CLK}$ of the first and second input clock signal CLK increases. For example, as shown in FIG. 7, a fast input clock signal CLK has a period $T_{CLK}$ of 8 nanoseconds, while the first and second internal clock signals CLK2× and CLK4× have periods of 16 and 32 nanoseconds, respectively. Referring to FIG. 6, a middle input clock signal CLK has a period $T_{CLK}$ of 11 nanoseconds, which results in periods for the first and second internal clock signals CLK2× and CLK4× of 22 and 44 nanoseconds, respectively. Referring to FIG. 5, a slow input clock signal CLK has a period $T_{CLK}$ of 13 nanoseconds, which corresponds to first and second internal clock signals CLK2× and CLK4× of 26 and 52, respectively.

Referring back to FIG. 3, the second internal clock signal CLK4× is input to a first input terminal of each of three NAND gates 54, 56, and 58. Each of the NAND gates 54, 56, and 58 receives at their second input a delayed version of the second internal clock signal CLK4×. Three serially coupled delay elements, a 9 nanosecond delay element 60 and two 3 nanosecond delay elements 61, receive at their common input the second internal clock signal CLK4×. The first NAND gate 54 receives at its second input the fully delayed CLK4× signal after passing through all of the delay elements 60 and 61, so that the CLK4× signal is delayed approximately 15 nanoseconds before being input to the NAND gate 54. The second NAND gate 56 receives at its second input a less delayed CLK4× signal after it has been delayed by the delay element 60 and one of the two delay elements 61, so as to be delayed 12 nanoseconds. The third NAND gate 58 receives at its second input the CLK4× signal after being delayed by only the delay element 60, so as to be delayed 9 nanoseconds.

While the delay elements 60 and 61 are employed by the present invention, alternative delay elements can be employed, such as substituting three substantially similar 3 nanosecond delay elements for the single 9 nanosecond delay element 61, or three different delay elements each having delays of 15, 12 and 9 nanoseconds. Also, a different type of multiclock generator circuits can be used such as those using a conventional phase-lock loop and decoder circuit. Moreover, different delay values can be employed, if suitable and appropriate changes are made to the balance of the circuitry for the clock frequency detector 36.

Each of the delayed CLK4× signals input to the second input of the NAND gates 54, 56, and 58 are first inverted by an inverter 62 before being input thereto. In operation, the NAND gates 54, 56, and 58 output an active (low) signal P15, P12 and P9, respectively, only when both of its inputs are high. For example, referring to FIG. 7, if the incoming clock signal CLK has a short period $T_{CLK}$ of 8 nanoseconds, then the first internal clock signal CLK2× has a period of two times $T_{CLK}$ or 16 nanoseconds. The second internal clock signal CLK4× consequently has a full period of four times $T_{CLK}$ or 32 nanoseconds, where during each period, the signal CLK4× has equal duration high and low periods of two times $T_{CLK}$ (16 nanoseconds). Therefore, the third NAND gate 58 outputs a low value for the signal P9 when the second internal clock signal CLK4× initially transitions to a present high value. The signal P9 stays low for about 9 nanoseconds, until the third NAND gate 58 receives the previous low value of the CLK4× signal, after the CLK2 signal has been delayed approximately 9 nanoseconds by the delay element 60 (and being inverted by the inverter 62).

Similarly, referring to FIG. 5, the first NAND gate 54 outputs a low value for the signal P15 when the second internal clock signal CLK4× initially transitions to a present high value, and the signal P15 stays low for about 15 nanoseconds until it receives the previous low value for the CLK4× signal, after the CLK4× signal has been delayed approximately 15 nanoseconds by the 3 delay elements 60 and 61. FIGS. 5–7 all show how the active low value of the output signals P9, P12 and P15 increases as the amount of delay increases (from 9 nanoseconds to 15 nanoseconds). In other words, if the time period $T_{CLK}$ of the input clock signal CLK is longer, and thus the frequency of the input clock signal CLK is less, then the period during which the output signals P9, P12 and P15 have an active low value increases. This results because the second internal clock signal CLK4× has a greater period (corresponding to the greater period $T_{CLK}$), but the amount of delay (9 to 15 nanoseconds) remains constant. The series of delay elements 60 and 61, inverters 62 and the NAND gates 54, 56 and 58 essentially determine how far the second internal clock signal CLK4× passes through the delay elements before the output of one of the NAND gates changes from an active low signal to an inactive high signal.

Figure 8:
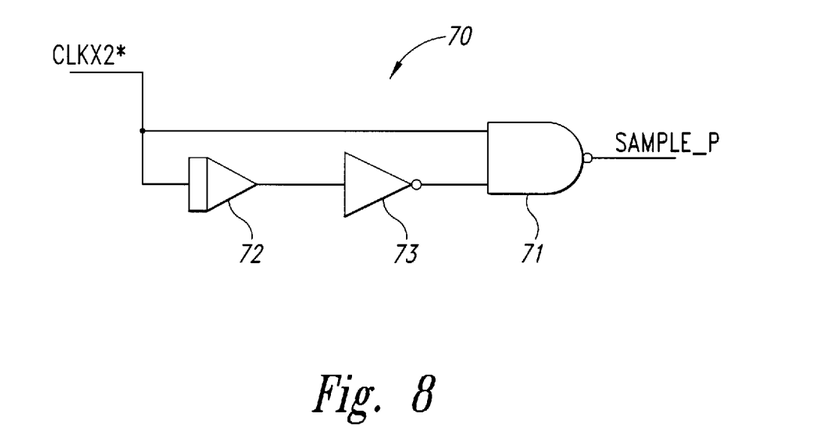
FIG. 8 is a schematic diagram of a one-shot circuit employed by the clock frequency detector of FIG. 3.
Figure 9:
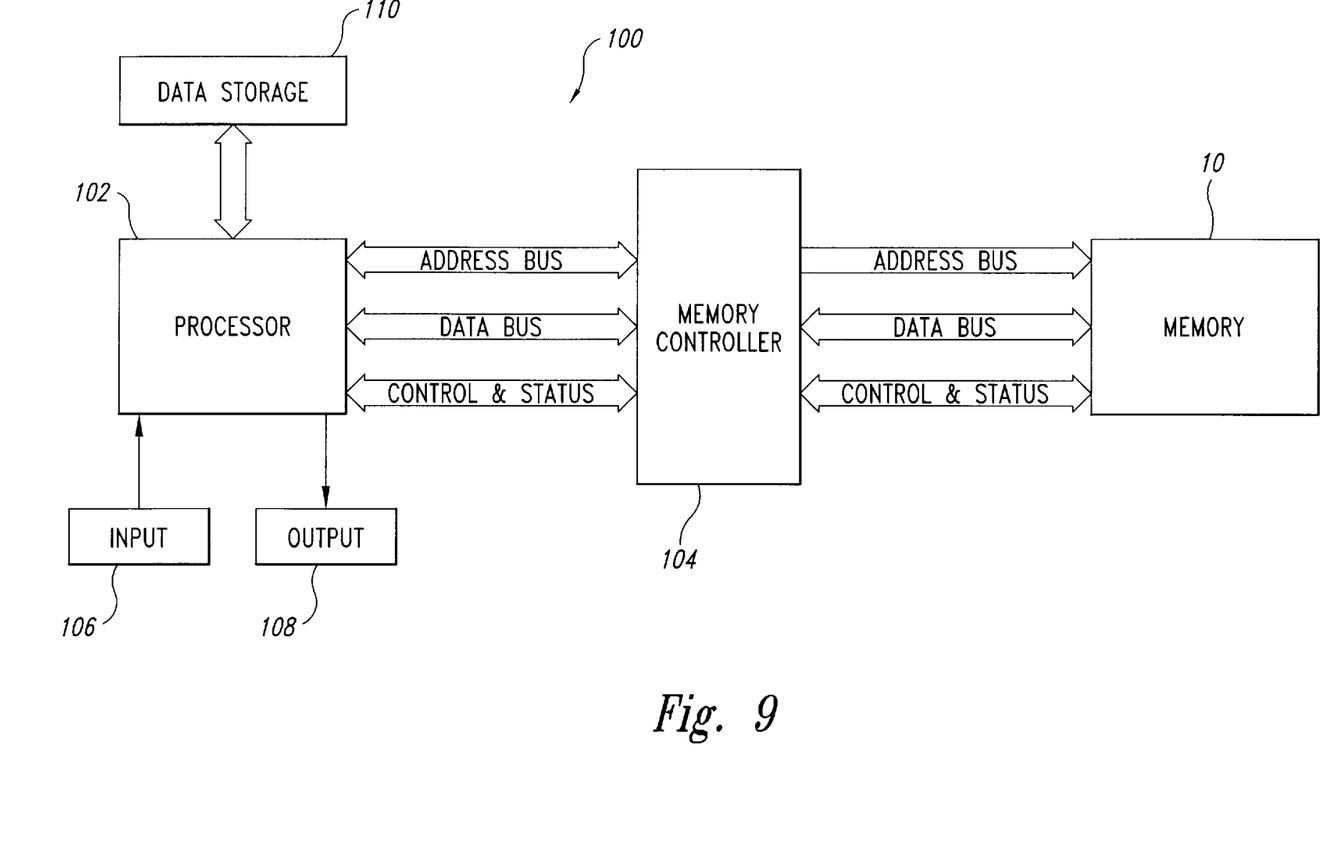
FIG. 9 is a block diagram of a computer system employing the memory device of FIG. 1.

First, second, and third NOR gates 64, 66, and 68 receives at a first input the output from the first, second, and third NAND gates 56, 58, and 58, respectively. A first one-shot 70 outputs a sample signal SAMPLE_P to the second input of each of the NOR gates 64, 66, and 68. Referring to FIG. 8, the one-shot 70 includes a NAND gate 71 that receives the invented clock signal CLK2× at its first input. The clock signal CLK2× is delayed by a delay element 72, inverted again by an inverter 73, and then input to the second input of the NAND gate 71. The delay element 72 preferably has a delay of approximately 1 nanosecond. As a result, the one-shot 70 supplies a short duration low value pulse in the sample signal SAMPLE_P when the CLK2× signal transitions to its low value. The one-shot 70 essentially converts a falling edge of an input signal into a short duration low value output pulse signal. FIGS. 5, 6 and 7 show exemplary the SAMPLE_P signals having short duration low value (e.g., 1–2 nanoseconds) when the one-shot 70 fires, after the first internal clock signal CLK2× falls. Referring back to FIG. 3, in response to the SAMPLE_P signal, the NOR gates 64, 66, and 68, acting, as pass gates, output slow, middle and fast detect signals S, M and F, respectively. In other words, the SAMPLE_ P signal causes the NOR gates 64, 66 and 68 to output a sample of the outputs from the NAND gates 54, 56 and 58 whenever the first internal clock signal CLK2× falls. Basically, the clock frequency analyzer is a timing circuit that generates three timing signals P15, P12, and P9 at the start of every other CLK signal, and the states of each of the three timing signals are sampled at the subsequent CLK signal to determine if the clock period is less than 15, 12, and 9 ns, respectively.

The first, second and third NOR gates 64, 66 and 68 are coupled to the decoder 46, which essentially includes three 3-input NAND gates 74, 76 and 78 that each receive the slow, normal and fast detect signals S, N, and F. As explained below, only one of the 3-input NAND gates 74, 76 or 78 outputs a signal depending upon the speed of the input clock signal CLK. The first 3-input NAND gates 74 receives the slow detect signal S, and inverted normal and fast detect signals N* and F*, after the normal and fast detect signals N and F each have inverted by an inverter 75. The second 3-input NAND gates 76 receives the slow and normal detect signals S and N, and the inverted fast detect signal F*. The third 3-input NAND gate 78 receives the slow, normal and fast detect signals S, N and F.

The first 3-input NAND gates 74 outputs al active low decode signal DECSLOW, indicating the input clock signal CLK has a slow rate, if the first NOR gate 64 outputs a high signal (slow detect signal S) while the second and third NOR gates 66 and 68 output low signal (normal and fast detect signals N and F, respectively). As shown in FIG. 5, when the first NOR gate 64 receives the active low SAMPLE_pulse, the NOR gate also receives a low value for the P15 signal output from the first NAND gate 54. The first NOR gate 64 therefore outputs a high sample signal. Conversely, when the second and third NOR gates 66 and 68 receive the SAMPLE_P pulse, the NOR gates receive high values for the P12 and P9 signals from the second and third NAND gates 56, 58, all respectively. The second and third NOR gates 66 and 68 therefore output low sample signals. These low sample signals are inverted by the respective inverters 75, to apply logic high signals to the NAND gate 74. Thus, if the period of the CLK signals is between 12 and 15 ns, the NAND gate 74 outputs a logic low DECSLOW signal when the one shot 70 outputs a low SAMPLE_P signal. At the same time, the lows at the outputs of the NOR gates 66, 68 prevent the NAND gates 76, 78 from outputting a logic low.

The second 3-input NAND gate 76 outputs an active low decode signal DECMID, indicating that the input clock signal CLK has a normal or middle rate, when the first and second NOR gates 64 and 66 output high values (for the slow and normal detect signals S and N), while the third NOR gate 68 outputs a low value (for the fast detect signal F). As shown in FIG. 6, when the input clock CLK has an intermediate period, the SAMPLE_P pulse coincides with low values for the output signals P15 and P12 from the first and second NAND gates 54 and 56 (thereby generating high outputs for the NOR gates 64 and 66), while coinciding with a high value for the P9 signal from the third NAND gate 58 (thereby generating a low output for the NOR gate 68). The low output from the NOR gate 68 is inverted by the inverter 75 so that the NAND gate 76 receives three logic high inputs. Thus, if the period of the CLK signal is between 9 and 12 ns, the NAND gate 76 outputs a logic low DECMID signal when the one-shot 70 outputs a low SAMPLE_P signal. At that time, the low at the output of the inverter 75 connected to the NOR gate 66 prevents the NAND gate 74 from outputting a logic low, and the low at the output of the NOR gate 68 prevents the NAND gate 78 from outputting a logic low. Thus, if the period of the CLK signal is between 9 and 12 ns, only the NAND gate 76 outputs a logic low.

The third 3-input NAND gate 78 outputs an active low decode signal DECFAST*, indicating that the input clock signal CLK has a fast rate, when the first, second and third NOR gates 64, 66 and 68 all output high values for the slow, normal and fast detect signals S, N and F. As shown in FIG. 7, when the input clock signal CLK has a short period $T_{CLK}$, the SAMPLE_P pulse coincides with low values for the output signals P15, P12 and P9 from the first, second and third NAND gates 54, 56, and 58, respectively. Thus, if the period of the CLK signal is less than 9 ns, the NAND gate 78 outputs a logic low DECFAST* signal when the one-shot 70 outputs a low SAMPLE_P signal. At the same time, the logic low signals at the outputs of the inverters 75 prevent the NAND gates 74, 76 from outputting a logic low. Thus, if the period of the CLK signal is less than 9 ns only the NAND gate 78 outputs a logic low.

Table 1 below summarizes the states required for the slow, normal or fast detect signals S, N and F for the decoder 46 to output either the slow decode signal DECSLOW, medium decode signal DECMID or fast decode signal DECFAST.

TABLE 1

|  | S | N | F |
| --- | --- | --- | --- |
| DECSLOW | low | high | high |
| DECMID | low | low | high |
| DECFAST | low | low | low |

The decode slow, middle and fast signals DECSLOW, DECMID, DECFAST are input to, and set first, second and third latches 84, 86 and 88, respectively. The latches 84, 86 and 88 consist of typical cross-coupled NAND gates function as respective S-R flip-flops, as shown in FIG. 3. When set by the DECSLOW, DECMID and DECFAST decode signals from the NAND gates 74, 76 and 78, the latches 84, 86 and 88 output logic high slow, normal and fast selection control signals 12 NS–15 NS, 9 NS–12 NS and 9 NS, all respectively. Since only one of the NAND gates 74, 76 or 78 output a signal, only one of the latches 84, 86 or 88 is set, depending upon the rate of the input clock signal CLK.

A second one-shot 80, having a construction similar to the first one-shot 70, receives an initializing signal LOADMODE from the control circuit 12. The control circuit 12 outputs the LOADMODE signal to the selector circuit 42 during initialization of the memory device 10, about 100 microseconds after power up of the device. In response to the LOADMODE signal, the second one-shot 80 outputs a latch reset signal RESET* that resets the latches 84, 86 and 88. After the frequency detector 40 has had sufficient time to analyze the input clock signal CLK and output the slow, middle and fast detect signals P9, P12 and P15, and after the latches 84, 86 and 88 of the selection circuit 42 have had sufficient time to provide the slow, normal or fast selection command signals 12 NS–15 NS, 9 NS–12 NS or 9 NS to the control circuit 12, respectively, the control circuit 12 outputs the LOADMODE signal to the one-shot 80. In response thereto, the one-shot 80 outputs the latch reset signal RESET* which resets the latches 84, 86 and 88. As shown in FIGS. 5, 6 and 7, when the LOADMODE signal goes high, the one-shot 80 outputs a low value for the RESET* signal. In response to the latch set signal RESET*, the first, second and third latches 84, 86 and 88 reset and all output thereafter a low value for the slow, normal and fast selection control signals 12 NS–15 NS, 9 NS–12 NS and 9 NS.

In response to the slow, normal or fast selection control signals 12 NS–15 NS, 9 NS–12 NS and 9 NS, the control circuit 12 employs the appropriate timing for the memory device 10 based on the speed of the input clock signal CLK. Specifically, the control circuit 12, in response to the selection control signals, selects one of three conventional timing paths in the device 100. For example, the fast timing path includes essentially no added delays along the path. The middle timing path includes a few 1- or 2-nanosecond delay elements along the path, while the slow timing path adds a greater number of delay elements along the path. While the timing paths in the control circuit 12 are not shown, it is believed that they are of conventional design and well within the knowledge or ability of one skilled in the relevant art.

Since the control circuit 12 now knows the speed of the incoming lock signal CLK, it can anticipate each clock pulse by precharging row lines, latching addresses, etc., to thereby improve the performance of the memory device 10, particularly when operating along the middle or slow timing paths. As a result, the clock frequency detector 36 allows the memory device 10 to be used with a variety of external clocks generating different input clock signals CLK having different frequencies. More importantly, the memory device 10 adjusts the speed of its internal operations, based on the frequency of the incoming clock signal CLK, so as to provide a decreasing margin of error for decreasing input clock frequency.

Since the memory device 10 benefits from being able to be used in a variety of applications having a variety of input clock signals, such applications similarly benefit from the present invention. For example, referring to FIG. 4, a block diagram of a computer system 100 that uses one or more memory devices 10 is shown. The computer system 100 includes a processor 102 for performing computer functions, such as executing software to perform desired calculations and tasks. The processor 102 is connected to one or more of the memory devices 10 through a memory controller 104 that provides the appropriate signals to the memory.

One or more input devices 106, such as a keypad or a mouse, are coupled to the processor 102 and allow an operator (not shown) to input data thereto. One or more output devices 108 are coupled to the processor 102 to provide the operator with data generated by the processor. Examples of output devices 108 include a printer and a video display unit. One or more data storage devices 110 are coupled to the processor 102 to store data on or retrieve data from external storage media (not shown). Examples of storage devices 110 and corresponding storage media include drives for hard and floppy disks, tape cassettes, and compact disc read-only memories (CD-ROMs). Typically, the processor 102 generates the input clock signal CLK and the address signals A0–A8, control signals such as CAS, RAS, WE, etc., and the data DQ0–DQ31 that is written to the memory device 10, as shown by the address, data, control, and status buses, shown in FIG. 5.

While the detailed description has been expressed, in part, in terms of specific examples, those skilled in the art will appreciate that many other variations could be used to accomplish the purpose of the disclosed invention. For example, those skilled in the art will recognize that the memory device 10 is generally described above as being a SDRAM device, but that the present invention is applicable to other memory devices. Additionally, the present invention is applicable to all circuits having clocked inputs, and which have a need to be operated in at least a fast and a slow mode.

Furthermore, while the clock frequency detector 36 described above detects three different input clock frequencies, the detector can detect only two, or more than three, with appropriate changes. Additionally, while the frequency detector 40 and selector circuit 42 are shown as consisting of a variety of logic circuit elements, other circuit elements can be employed. For example, the frequency detector 40 could include a phase locked loop circuit. Accordingly, those skilled in the art will appreciate that equivalent modifications to the above embodiments can be made without departing from the spirit and scope of the invention. Therefore, the present invention is limited only by the following claims.

We claim:

1. A semiconductor memory device, comprising:

an array of memory cells;

a control circuit coupled to the array of memory cells and receiving a clock signal having a predetermined frequency, the control circuit being operable to transfer data to and from the array of memory cells based on the predetermined frequency of the clock signal, the control circuit operating in at least first and second modes of operation responsive to a respective first and second selection signal; and a clock frequency detector having a frequency detector and a selector circuit, the frequency detector receiving the clock signal and detecting the predetermined frequency of the clock signal, and the selector circuit being coupled to the frequency detector and the control circuit and outputting either the first or the second selection signal to the control circuit in response to the predetermined frequency determined by the frequency detector.

2. The semiconductor memory device of claim 1 wherein the control circuit receives the clock signal from an external clock, wherein the predetermined frequency of the clock signal is either a fast or slow frequency, wherein the first and second modes of operation are fast and slow modes of transferring data to and from the array of memory cells, wherein the frequency detector detects whether the predetermined frequency of the clock signal is either the fast or slow frequency; and wherein the selector circuit outputs the first selection signal if the frequency detector determines that the predetermined frequency is the fast frequency and outputs the second selection signal if the frequency detector determines that the predetermined frequency is the slow frequency.

3. The semiconductor memory device of claim 1 wherein the predetermined frequency of the clock signal is either a fast or slow frequency, wherein the frequency detector detects whether the predetermined frequency of the clock signal is either the fast or slow frequency, and wherein the selector circuit outputs the first selection signal if the frequency detector determines that the predetermined frequency is the fast frequency and outputs the second selection signal if the frequency detector determines that the predetermined frequency is the slow frequency.

4. The semiconductor memory device of claim 1 wherein the predetermined frequency of the clock signal is either a fast or slow frequency, wherein the frequency detector includes an internal clock signal generator that receives the clock signal and outputs at least a first internal clock signal, a clock frequency analyzer coupled to receive the internal clock signal and output at least fast and slow detect signals, and a sampling circuit coupled to receive the fast and slow detect signals and output at least fast and slow sampled signals, and wherein the selector circuit includes a decoder coupled to receive the fast and slow sampled signals and output one of a decoded fast or slow signal, a latch circuit coupled to receive the one decoded fast or slow signal and output one of the first and second selection signal to the control circuit, and a reset circuit coupled between the control circuit and the latch circuit for receiving a predetermined time signal from the control circuit and outputting a reset signal to the latch circuit in response thereto.

5. The semiconductor memory device of claim 1 wherein the predetermined frequency of the clock signal is either a fast or slow frequency, wherein the frequency detector outputs a fast signal and a slow signal, and wherein the selector circuit includes:

a decoder coupled to a frequency detector and to the control circuit for receiving the fast and slow signal and outputting the first selection signal if the predetermined frequency is the fast frequency, and outputs the second selection signal if the predetermined frequency is the slow frequency.

6. In a device operating at a speed that is determined by a clock signal and having at least two modes of operation, a system comprising:

a clock frequency detector having a frequency detector circuit and a selector circuit, the frequency detector circuit receiving the clock signal and determining the frequency of the clock signal, the selector circuit outputting one of a first and second selection signals as a function of the frequency of the clock signal; and a control circuit receiving the first and second selection signals, the control circuit operating the device in a fast or a slow mode responsive to receipt of the first or second selection signal, respectively, the fast and slow modes each providing different enhanced functionality for the device.

7. The system of claim 6 wherein the predetermined frequency of the clock signal is either a fast or slow frequency, wherein the frequency detector circuit detects whether the predetermined frequency of the clock signal is either the fast or slow frequency, wherein the selector circuit outputs the first selection signal if the frequency detector circuit determines that the predetermined frequency is the fast frequency and outputs the second selection signal if the frequency detector circuit determines that the predetermined frequency is the slow frequency, and wherein the slow mode provides a greater margin of error for the functionality of the device.

8. The system of claim 6 wherein the predetermined frequency of the clock signal is either a fast or slow frequency, wherein the frequency detector circuit includes an internal clock signal generator that receives the clock signal and outputs at least a first internal clock signal, a clock frequency analyzer coupled to receive the internal clock signal and output at least fast and slow detect signals, and a sampling circuit coupled to receive the fast and slow detect signals and output at least fast and slow sampled signals, and wherein the selector circuit includes a decoder coupled to receive the fast and slow sampled signals and output one of a decoded fast or slow signal, a latch circuit coupled to receive the one decoded fast or slow signal and output one of a first and second selection signal to the control circuit, and a reset circuit coupled between the control circuit and the latch circuit for receiving a predetermined time signal from the control circuit and outputting a reset signal to the latch circuit in response thereto.

9. A computer system, comprising:
an input device;
an output device;
an address bus;
a data bus;
a set of control lines;
a memory controller coupled to the address and data buses and the set of control lines;
a processor coupled to the input and output devices, and to the address and data buses and the set of control lines; and
a memory device coupled to the memory controller through the address and data buses and the set of control lines, the memory device comprising:
an array of memory cells;
a control circuit coupled to the array of memory cells and receiving a clock signal having a predetermined frequency, the control circuit being operable to transfer data to and from the array of memory cells based on a predetermined frequency of the clock signal, the control circuit having at least first and second modes of operation; and
a clock frequency detector having a frequency detector and a selector circuit, the frequency detector receiving the clock signal and determining the predetermined frequency of the clock signal, and the selector circuit being coupled to the frequency detector and the control circuit and outputting one of a first and second selection signal to the control circuit in response to the predetermined frequency determined by the frequency detector, the control circuit operating in the first or second mode based on the first or second selection signal, respectively.

10. The computer system of claim 9 wherein the predetermined frequency of the clock signal is either a fast or slow frequency, wherein the frequency detector circuit detects whether the predetermined frequency of the clock signal is either the fast or slow frequency, and wherein the selector circuit outputs the first selection signal if the frequency detector circuit determines that the predetermined frequency is the fast frequency and outputs the second selection signal if the frequency detector circuit determines that the predetermined frequency is the slow frequency.

11. A method of controlling operation of a semiconductor memory device that is capable of operating at a speed determined by a clock signal and having at least two modes of operation, the method comprising:
receiving an input clock signal;
determining whether a frequency of the input clock signal is a fast or a slow frequency;
operating the semiconductor memory device in a fast mode if the frequency of the input clock signal is the fast frequency; and
operating the semiconductor memory device in a slow mode if the frequency of the input clock signal is the slow frequency, the slow mode providing a reduced error rate for the semiconductor memory device than the fast mode.

12. The method of claim 11 wherein determining includes determining whether the frequency of the input clock signal is a medium speed frequency, and wherein the method further comprises operating the semiconductor device in a medium speed mode if the frequency of the input clock signal is the medium speed frequency.

13. The method of claim 11, further comprising providing a fast mode signal or a slow mode signal based on the determining.

14. The method of claim 11, further comprising generating internal clock signals based on the input clock signal, and analyzing the internal clock signals to determine whether the frequency of the input clock signal is a fast or slow frequency.

15. In a device operating at a speed that is determined by a clock signal having at least two modes of operation, a system comprising:
a clock frequency detector receiving the clock signal and outputting one of first and second selection signals based on a function of the frequency of the clock signal; and
a control circuit receiving the outputted selection signal and operating the device in a first or a second mode in response to the selection signal.

16. A memory device operable in first and second modes, comprising:
a clock frequency detector for receiving a clock signal and in response to said received clock signal outputting one of first and second selection signals based on a function of the frequency of the clock signal; and
a control circuit receiving the outputted selection signal and operating the device in a first or second mode in response to the selection signal.

17. The method of controlling operation of a semiconductor memory device capable of operating at a speed determined by a clock signal and having at least two modes of operation, comprising:
receiving said clock signal having a frequency; and
operating a semiconductor memory device in one of said first and second modes in response to the frequency of said clock signal.

18. The method of claim 17 wherein, the receiving includes receiving the clock signal having either a fast or a slow frequency, and wherein operating the semiconductor memory device includes operating said semiconductor memory device in a fast mode or a slow mode in response to said fast and slow frequencies, respectively.

19. The method of claim 17, further comprising generating first and second mode signals in response to said frequency of said clock signal.

20. The method of claim 17 wherein operating the semiconductor memory device includes operating the semiconductor memory device in a third mode in response to the frequency of said clock signal, wherein said third mode differs from said first and second modes.

21. The method of claim 17, further comprising delaying the received clock signal to produce an internal clock signal, and wherein operating the semiconductor memory device includes operating the semiconductor memory device in one of said first and second modes based on a speed of said internal clock signal.

22. The method of claim 17, further comprising resetting said semiconductor memory device upon initialization of said semiconductor memory device, before the operating.

23. A method of operating a semiconductor memory device, comprising:
receiving a clock signal having a frequency;
analyzing the frequency of the received clock signal and producing output signals;
decoding the output signals; and
providing slow or fast mode control signals based on the decoded output signals.

24. The method of claim 23, further comprising generating internal clock signals, including delaying the received clock signal.

25. The method of claim 23, further comprising sampling the output signals before decoding.

26. The method of claim 23, further comprising latching the fast and slow mode control signals.

27. The method of claim 23, further comprising resetting the fast and slow control mode signals upon initialization of the semiconductor memory device.

28. The method of claim 23, further comprising generating at least one internal clock signal based on the received clock signal.

29. A method of controlling the operation of a clocked semiconductor electronic device receiving a clock signal, comprising:
providing an internal clock signal generator that receives the clock signal and produces at least one internal clock signal;
providing an internal clock signal analysis circuit that analyzes the internal clock signal and produces first and second output signals based on whether the internal clock signal has first or second rate values, respectively; and
operating the clocked semiconductor electronic device in first and second modes based on the first and second output signals.

30. The method of claim 29 wherein providing the internal clock signal generator includes delaying the received clock signal.

31. The method of claim 29 wherein providing the internal clock signal analysis circuit includes sampling first and second internal output signals, and decoding the first and second internal output signals.

32. The method of claim 29 wherein providing the internal clock signal analysis circuit includes decoding the internal clock signal before producing the first and second output signals.

33. The method of claim 29, further comprising latching the first and second output signals.

34. The method of claim 29, further comprising resetting the first and second output signals upon initialization of the clocked semiconductor electronic device.

* * * * *

UNITED STATES PATENT AND TRADEMARK OFFICE
CERTIFICATE OF CORRECTION

PATENT NO. : 5,883,853
DATED : March 16, 1999
INVENTOR(S) : Zheng, et. al.

It is certified that error appears in the above-identified patent and that said Letters Patent is hereby corrected as shown below:

| | | |
|---|---|---|
| Column 8, line 42 | "al" | -- an -- |
| Column 8, line 48 | "SAMPLE _ pulse" | -- SAMPLE _ P pulse -- |
| Column 10, line 34 | "lock" | -- clock -- |

Signed and Sealed this

First Day of May, 2001

Attest:

NICHOLAS P. GODICI

Attesting Officer

Acting Director of the United States Patent and Trademark Office